(12) United States Patent
Yamauchi et al.

(10) Patent No.: US 8,610,101 B2
(45) Date of Patent: Dec. 17, 2013

(54) NONVOLATILE VARIABLE RESISTANCE ELEMENT HAVING A VARIABLE RESISTIVE LAYER DISPOSED BETWEEN FIRST AND SECOND ELECTRODES

(75) Inventors: Takashi Yamauchi, Kanagawa (JP); Shosuke Fujii, Kanagawa (JP); Reika Ichihara, Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 13/359,880

(22) Filed: Jan. 27, 2012

(65) Prior Publication Data
US 2012/0292586 A1     Nov. 22, 2012

(30) Foreign Application Priority Data

May 16, 2011   (JP) ................................. 2011-109820

(51) Int. Cl.
*H01L 29/02*   (2006.01)

(52) U.S. Cl.
USPC ...... 257/4; 257/2; 257/3; 257/5; 257/E29.002; 438/102; 438/103; 438/104

(58) Field of Classification Search
USPC .................. 257/1–5, E29.002; 438/102–104
See application file for complete search history.

(56) References Cited

U.S. PATENT DOCUMENTS

2007/0159867 A1   7/2007   Muraoka et al.
2011/0240949 A1 * 10/2011   Mitani et al. ...................... 257/4

OTHER PUBLICATIONS

Sung Hyun Jo, et al., "CMOS Compatible Nanoscale Nonvolatile Resistance Switching Memory", Nano Letters vol. 8, No. 2 Jan. 25, 2008, pp. 392-397.

* cited by examiner

*Primary Examiner* — Jami M Valentine
(74) *Attorney, Agent, or Firm* — Oblon, Spivak, McClelland, Maier & Neustadt, L.L.P.

(57) ABSTRACT

According to one embodiment, there are provided a first electrode, a second electrode containing a 1B group element having an Al element added thereto, and a variable resistive layer disposed between the first electrode and the second electrode and having a silicon element.

20 Claims, 14 Drawing Sheets

FIG.9A
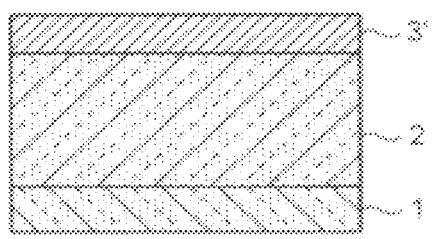
FIG.9B
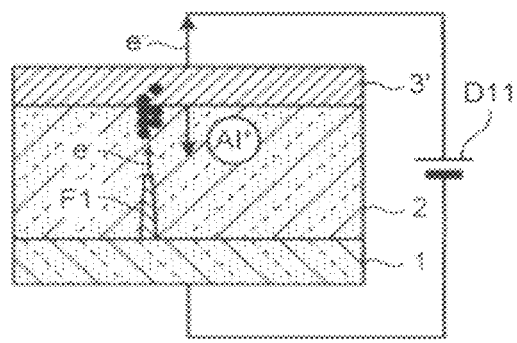
FIG.9F
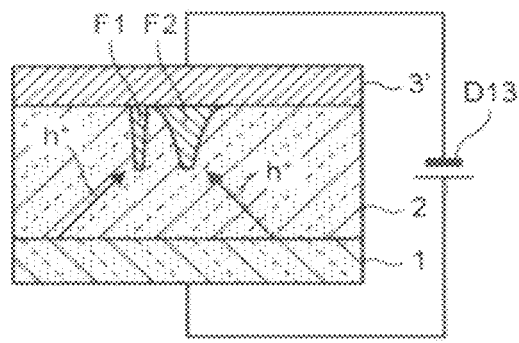
FIG.9C
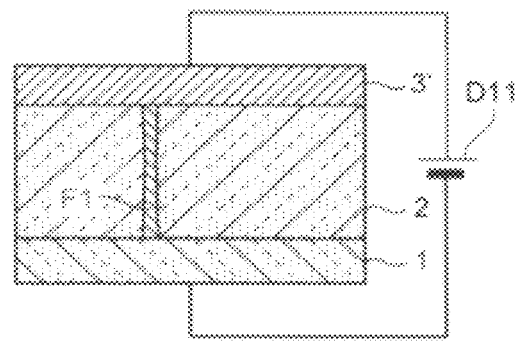
FIG.9E
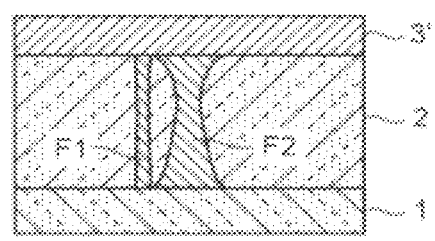
FIG.9D
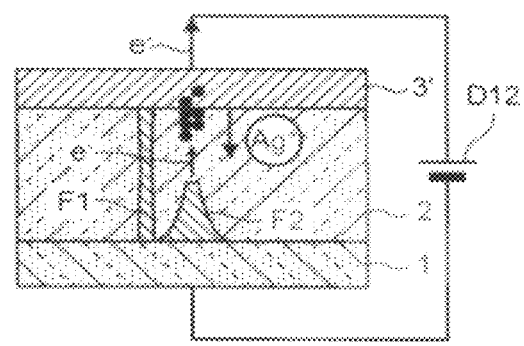

NONVOLATILE VARIABLE RESISTANCE ELEMENT HAVING A VARIABLE RESISTIVE LAYER DISPOSED BETWEEN FIRST AND SECOND ELECTRODES

CROSS-REFERENCE TO RELATED APPLICATIONS

This application is based upon and claims the benefit of priority from Japanese Patent Application No. 2011-109820, filed on May 16, 2011; the entire contents of which are incorporated herein by reference.

FIELD

Embodiments described herein relate generally to a nonvolatile variable resistance element.

BACKGROUND

An NAND type flash memory spreads as a device for storing large capacity data. Currently, a storage device is made fine to progress a reduction in a cost or an increase in a capacity per bit.

On the other hand, it is also expected to practically apply a new storage device (hereinafter referred to as a memory) based on a different operation principle from a floating gate type flash memory according to the related art.

For example, a two-terminal memory represented by an ReRAM (Resistive Random Access memory) is considered to be promising as a next generation memory in respect of an easiness of a low voltage operation, high speed switching and a refinement, or the like. Examples of the two-terminal memory include a memory using an amorphous silicon layer (which will be hereinafter referred to as an amorphous silicon layer or abbreviated as an a-Si layer) in a variable resistive layer. Referring to the two-terminal memory, a conductive filament is generated in or is made to disappear from the amorphous silicon layer so that a resistance is reversibly varied. In order to stably operate the two-terminal memory, it is demanded to enhance a stability of the conductive filament generated in the amorphous silicon layer, thereby improving a data retention property.

BRIEF DESCRIPTION OF THE DRAWINGS

FIGS. 9A-9F are sectional views schematically illustrating a generation process and a disappearance process for a conductive filament of a nonvolatile variable resistance element according to a third embodiment;

DETAILED DESCRIPTION

In general, according to one embodiment, there are provided a first electrode, a second electrode containing a 1B group element having an Al element added thereto, and a variable resistive layer disposed between the first electrode and the second electrode and having a silicon element.

A nonvolatile variable resistance element according to embodiments will be described below with reference to the drawings. The present invention is not restricted to the embodiments.

First Embodiment

Figure 1:
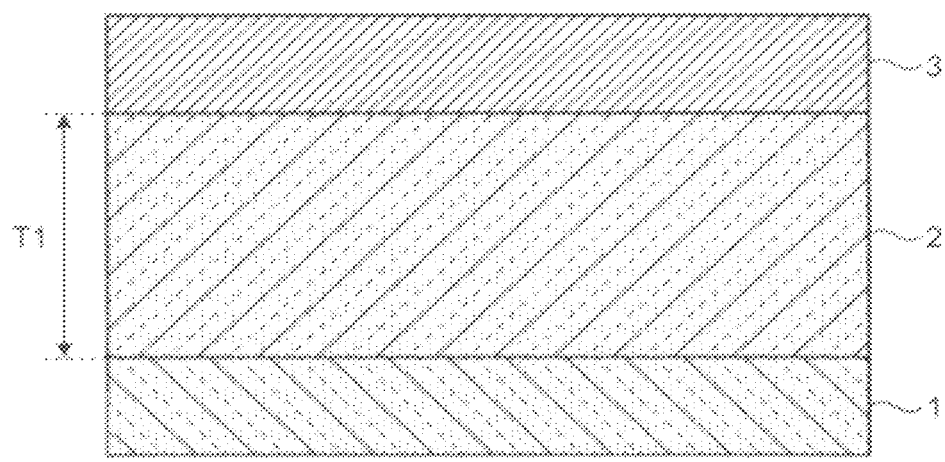
FIG. 1 is a sectional view illustrating a schematic structure of a nonvolatile variable resistance element according to a first embodiment.

FIG. 1 is a sectional view illustrating a schematic structure of a nonvolatile variable resistance element according to a first embodiment.

In FIG. 1, a variable resistive layer 2 is provided on a first electrode 1 and a second electrode 3 is provided on the variable resistive layer 2 in the nonvolatile variable resistance element.

The variable resistive layer 2 has a silicon element. For example, the variable resistive layer 2 may be an amorphous silicon layer, a polycrystalline silicon layer or a single crystal silicon layer. Moreover, a film thickness T1 of the variable resistive layer 2 is typically 1 nm to 300 nm. In consideration of a refinement of the device, a smaller film thickness is preferable. If the film thickness is excessively small, a uniform film cannot be obtained. For this reason, it is more preferable that the film thickness should be 2 nm to 50 nm.

Moreover, impurity doped silicon can be used for the first electrode 1. For example, it is possible to implant a B ion, an As ion or a P ion which has a high concentration into silicon in such a manner that a resistivity of the first electrode 1 is equal to or lower than 0.005 Ωcm. For the first electrode 1, the other conductive materials may be used. For example, it is possible to use, as the first electrode 1, Ti, Ni, Co, Fe, Cr, Cu, W, Hf, Ta, Pt, Ru, Zr or Ir, their nitrides or carbides, a chalcogenide material or the like. Furthermore, an alloy material containing the metals or semiconductor elements may be used as the first electrode 1. In addition, the first electrode 1 and the second electrode 3 may contain the same metal. However, it is preferable that the first electrode 1 should be constituted by a material which is harder to ionize than the second electrode 3.

Furthermore, the second electrode 3 contains a metal element having a 1B group element having an Al element added thereto. For the 1B group element, it is possible to use Cu, Ag or Au. Since the Al element and the 1B group element are not silicided, they can repetitively enter or exit from the variable resistive layer 2. Consequently, it is possible to reversibly vary the resistance of the variable resistive layer 2.

In the nonvolatile variable resistance element, the conductive filament constituted by the 1B group element supplied from the second electrode 3 is formed on the variable resistive layer 2, resulting in a change from a high resistive state to a low resistive state. Moreover, the 1B group element of the conductive filament formed on the variable resistive layer 2 is collected into the second electrode 3 so that the conductive filament formed on the variable resistive layer 2 is reduced, resulting in a change from the low resistive state to the high resistive state.

In the variable resistive layer 2, the 1B group element of the second electrode 3 is ionized and penetrates the variable resistive layer 2, and the ionized 1B group element bonds to an electron so that the conductive filament is formed. Moreover, a hole is supplied to the conductive filament formed on the variable resistive layer 2, and the 1B group element is ionized so that the conductive filament is decomposed and the conductive filament is reduced.

At this time, the Al element has a lower activation energy for the ionization than the 1B group element. Therefore, the Al element can penetrate the variable resistive layer 2 before the 1B group element penetrates the variable resistive layer 2. When the Al element penetrates the variable resistive layer 2, the Al element is ionized and surrounding silicon elements are charged to be negative. As a result, the electron of the 1B group element constituting the conductive filament can escape into the silicon element with difficulty and the 1B group element can be prevented from being ionized in the variable resistive layer 2. Also in the case in which the 1B group element in the silicon element is unstable, therefore, it is possible to suppress the decomposition of the conductive filament formed on the variable resistive layer 2 and to enhance a stability of the conductive filament generated on the variable resistive layer 2. Therefore, it is possible to improve a data retention characteristic.

When a composition ratio of the Al element contained in the second electrode 3 is represented by X and a silicon density of the variable resistive layer 2 is represented by Y (g/cm$^3$), it is preferable that X≥1.0−Y/2.3 should be set in order to prevent the 1B group element from being ionized in the variable resistive layer 2. A value of 2.3 represents a silicon density of an ideal amorphous silicon layer, and the silicon density has an almost equal value also in the case of a single crystal silicon layer and a polycrystalline silicon layer. In the ideal amorphous silicon layer, moreover, a value of 1.0−Y/2.3 represents a porosity in the variable resistive layer 2.

FIGS. 2A-2E are sectional views schematically illustrating the generation process and the disappearance process for the conductive filament of the nonvolatile variable resistance element in FIG. 1. Description will be given on the assumption that the 1B group element of the second electrode 3 is silver Ag.

Figure 2A:
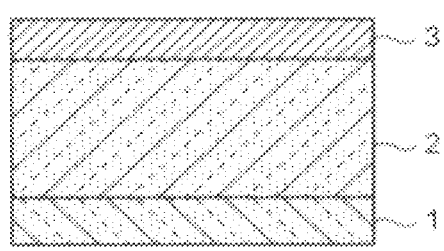
FIGS. 2A-2E are sectional views schematically illustrating a generation process and a disappearance process for a conductive filament of the nonvolatile variable resistance element in FIG. 1.

Referring to FIG. 2A, in the generation process for a conductive filament F, a power supply D1 is connected between the first electrode 1 and the second electrode 3, and the second electrode 3 is set to have a higher electric potential than the first electrode 1. Consequently, a set voltage is applied to the second electrode 3.

Figure 2B:
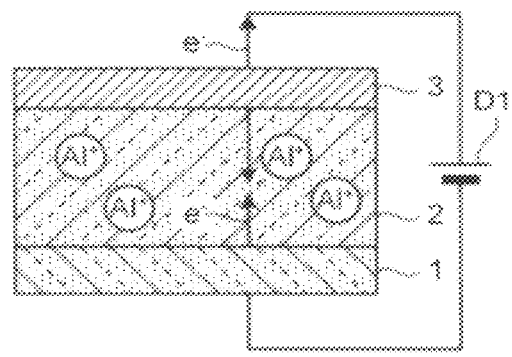

When the set voltage is applied to the second electrode 3, the aluminum Al of the second electrode 3 is ionized over an interface between the variable resistive layer 2 and the second electrode 3, an aluminum ion Al$^+$ penetrates the variable resistive layer 2, and furthermore, an electron e$^-$ is supplied to the variable resistive layer 2 through the first electrode 1 as illustrated in FIG. 2B. The Al element easily bonds to the silicon element and the Al element is present as the aluminum ion Al$^+$ in the variable resistive layer 2, and furthermore, the surrounding silicon elements are charged to be negative.

Figure 2D:
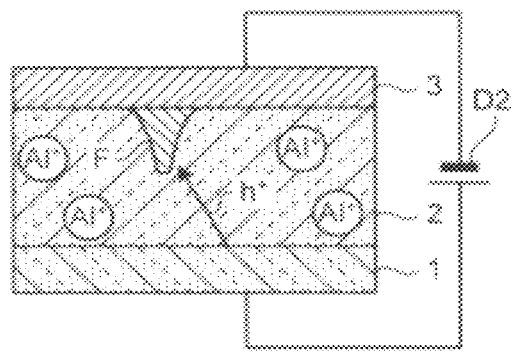
Figure 2C:
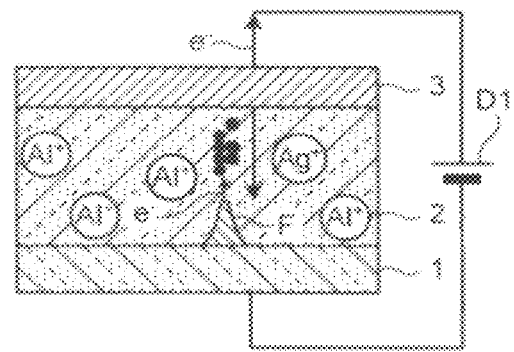

As illustrated in FIG. 2C, then, the silver Ag of the second electrode 3 is ionized over the interface between the variable resistive layer 2 and the second electrode 3, the silver ion Ag$^+$ penetrates the variable resistive layer 2, and furthermore, the electron e$^-$ is supplied to the variable resistive layer 2 through the first electrode 1. In the variable resistive layer 2, the silver ion Ag$^+$ bonds to the electron e$^-$ so that the conductive filament F formed of the silver Ag grows from the first electrode 1 side.

As illustrated in FIG. 2D, thereafter, the conductive filament F formed of the silver Ag grows over the variable resistive layer 2, and the first electrode 1 and the second electrode 3 are short-circuited through the conductive filament F. Consequently, the nonvolatile variable resistance element is set into the low resistive state.

By charging the silicon element around the aluminum ion Al$^+$ to be negative, it is possible to make the electron e$^-$ of the silver Ag constituting the conductive filament F to escape into the silicon element with difficulty. Consequently, it is possible to prevent the silver Ag from being ionized in the variable resistive layer 2. Also in the case in which the silver Ag in the silicon element is unstable, therefore, the decomposition of the conductive filament F formed on the variable resistive layer 2 can be suppressed and the stability of the conductive filament F generated on the variable resistive layer 2 can be enhanced. Therefore, a data retention characteristic can be improved.

Figure 2E:
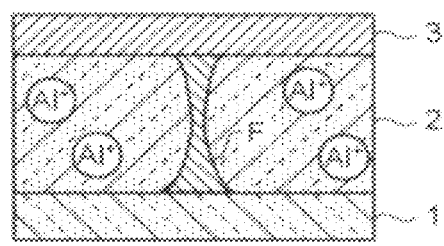

On the other hand, as illustrated in FIG. 2E, a power supply D2 is connected between the first electrode 1 and the second electrode 3, and the first electrode 1 is set to have a higher electric potential than the second electrode 3 so that a reset voltage is applied to the second electrode 3 in the disappearance process for the conductive filament F.

When the reset voltage is applied to the second electrode 3, the aluminum ion Al$^+$ is collected into the second electrode 3, and furthermore, the hole h$^+$ is supplied to the variable resistive layer 2 through the first electrode 1 so that the silver Ag of the conductive filament F is ionized in the variable resistive layer 2. Thereafter, the silver ion Ag$^+$ is collected into the second electrode 3 and the conductive filament F is disconnected in the variable resistive layer 2 so that the nonvolatile variable resistance element is reset into the high resistive state.

FIGS. 3A-3E are sectional views illustrating a flow of an electron and a metal ion in the generation process for the conductive filament of the nonvolatile variable resistance element in FIG. 1.

Figure 3A:
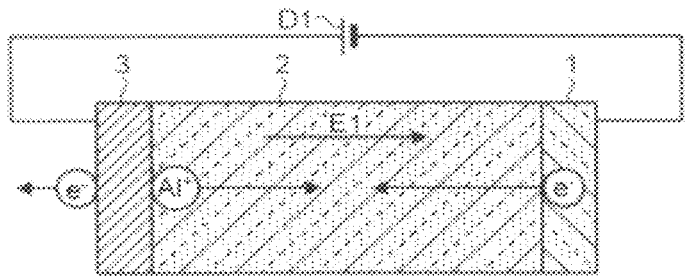
FIGS. 3A-3E are sectional views illustrating a flow of an electron and a metal ion in the generation process for the conductive filament of the nonvolatile variable resistance element in FIG. 1.

In FIG. 3A, when a set voltage is applied to the second electrode 3, an electric field E1 from the second electrode 3 toward the first electrode 1 is applied across the variable resistive layer 2. The aluminum Al of the second electrode 3 is ionized over the interface between the variable resistive layer 2 and the second electrode 3 so that the aluminum ion Al$^+$ penetrates the variable resistive layer 2, and furthermore, the electron e$^-$ is supplied to the variable resistive layer 2 through the first electrode 1.

Figure 3B:
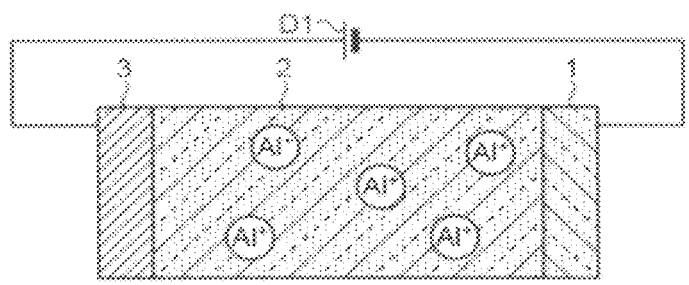

As illustrated in FIG. 3B, the presence of an Al atom as an ion in Si is stable on an energy basis and the Al element is present as an aluminum ion Al$^+$ in the variable resistive layer 2, and furthermore, surrounding silicon elements are charged to be negative.

Figure 3C:
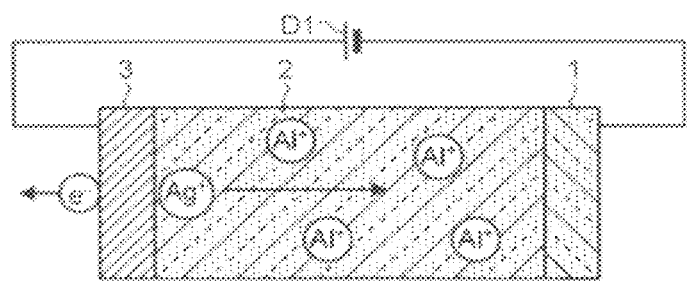

As illustrated in FIG. 3C, next, the silver Ag of the second electrode 3 is ionized over the interface between the variable resistive layer 2 and the second electrode 3 and the silver ion Ag$^+$ penetrates the variable resistive layer 2, and furthermore, the electron e$^-$ is supplied to the variable resistive layer 2 through the first electrode 1.

Figure 3D:
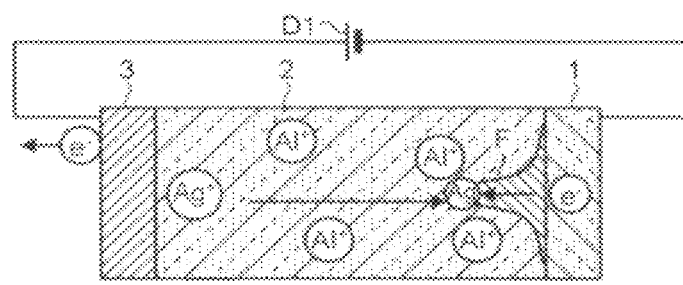

As illustrated in FIG. 3D, then, the silver ion Ag$^+$ supplied through the variable resistive layer 2 bonds to the electron e$^-$ supplied through the first electrode 1 in the variable resistive layer 2. Consequently, the silver Ag is deposited on the variable resistive layer 2 and the conductive filament F grows from the first electrode 1 side.

Figure 3E:
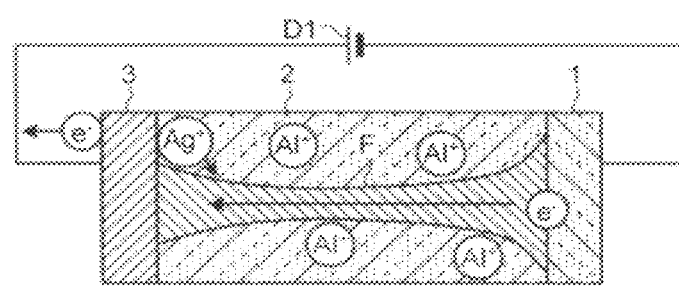

As illustrated in FIG. 3E, thereafter, the conductive filament F grows in the variable resistive layer 2 and the first electrode 1 and the second electrode 3 are short-circuited through the conductive filament F. Consequently, the nonvolatile variable resistance element is set into the low resistive state.

Figure 4A:
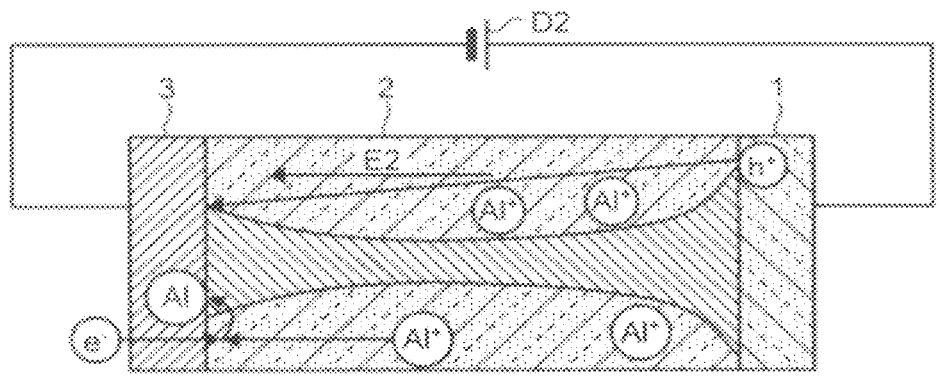
FIGS. 4A-4C are sectional views illustrating a flow of a hole and a metal ion in the disappearance process for the conductive filament of the nonvolatile variable resistance element in FIG. 1.
Figure 4B:
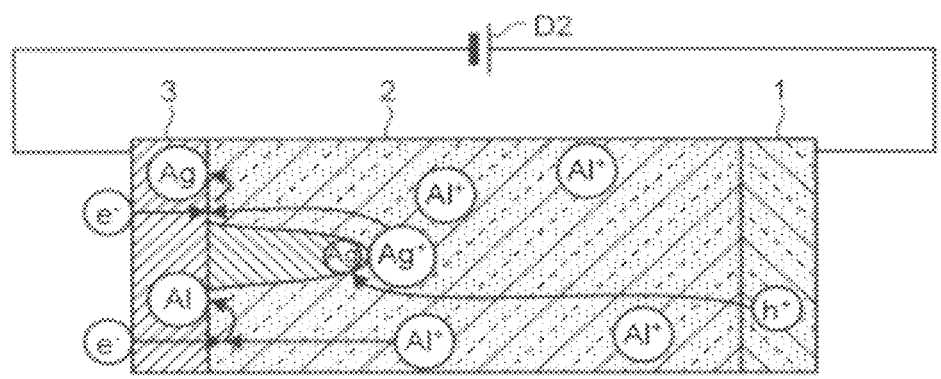
Figure 4C:
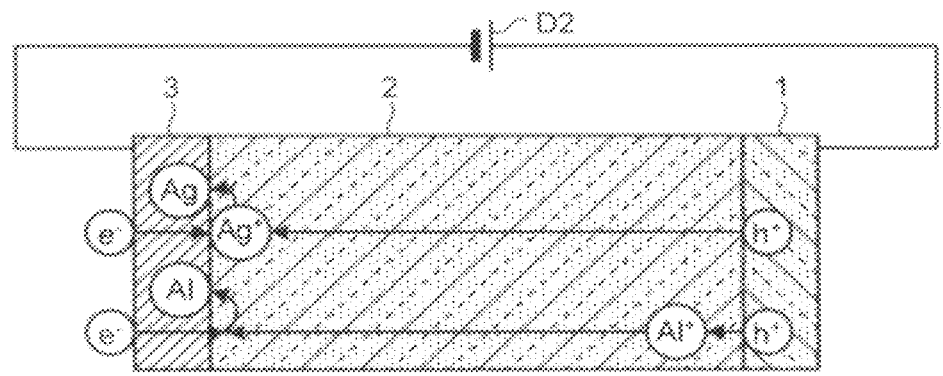

FIGS. 4A-4C are sectional views illustrating a flow of a hole and a metal ion in the disappearance process for the conductive filament of the nonvolatile variable resistance element in FIG. 1.

In FIG. 4A, when a reset voltage is applied to the second electrode 3, an electric field E2 from the first electrode 1 toward the second electrode 3 is applied across the variable resistive layer 2 so that a hole h$^+$ is supplied to the variable resistive layer 2 through the first electrode 1.

Moreover, the aluminum ion Al$^+$ advances in the variable resistive layer 2 in accordance with the electric field E2 and is collected into the second electrode 3. Consequently, the aluminum ion Al$^+$ in the variable resistive layer 2 is decreased, and furthermore, the aluminum ion Al$^+$ bonds to the electron e$^-$ and returns to the aluminum Al in the second electrode 3.

As illustrated in FIG. 4B, when the hole h$^+$ is supplied to the variable resistive layer 2, the silver Ag of the conductive filament F in the variable resistive layer 2 is ionized. Then, the silver ion Ag$^+$ advances in the variable resistive layer 2 in accordance with the electric field E2 and is collected into the second electrode 3. Consequently, the conductive filament F in the variable resistive layer 2 is reduced, and furthermore, the silver ion Ag$^+$ bonds to the electron e$^-$ and returns to the silver Ag in the second electrode 3.

As illustrated in FIG. 4C, thereafter, the reduction in the conductive filament F in the variable resistive layer 2 progresses so that the conductive filament F disappears in the variable resistive layer 2. Consequently, the nonvolatile variable resistance element is reset into the high resistive state.

Figure 5:
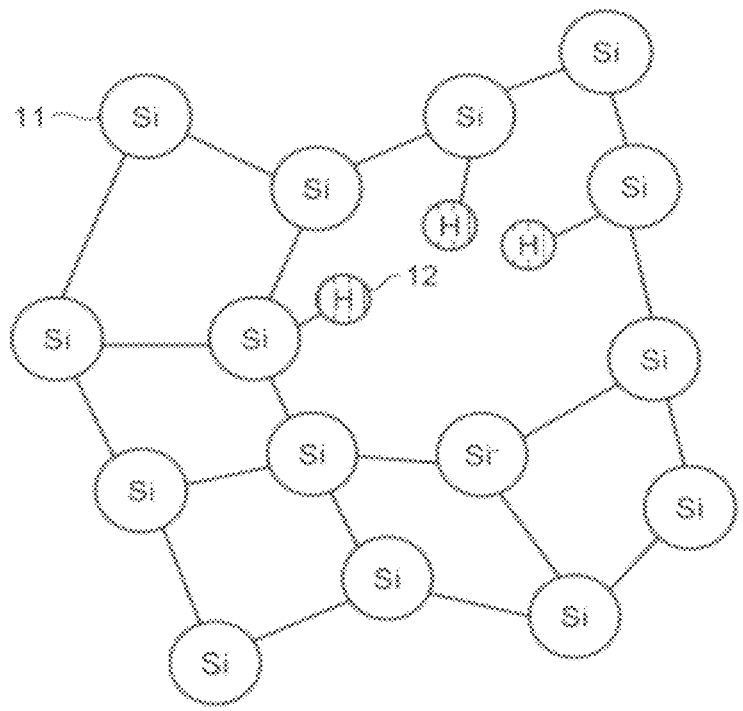
FIG. 5 is a view illustrating a state of an element of a variable resistive layer 2 in FIG. 2A.

FIG. 5 is a view illustrating a state of the element of the variable resistive layer 2 in FIG. 2A.

In FIG. 5, a void portion is present between the silicon elements 11 in the amorphous silicon layer, and a dangling bond is present in the silicon element 11. In order to enhance a mobility, a hydrogen element 12 can be linked to the dangling bond generated in the void portion.

Figure 6:
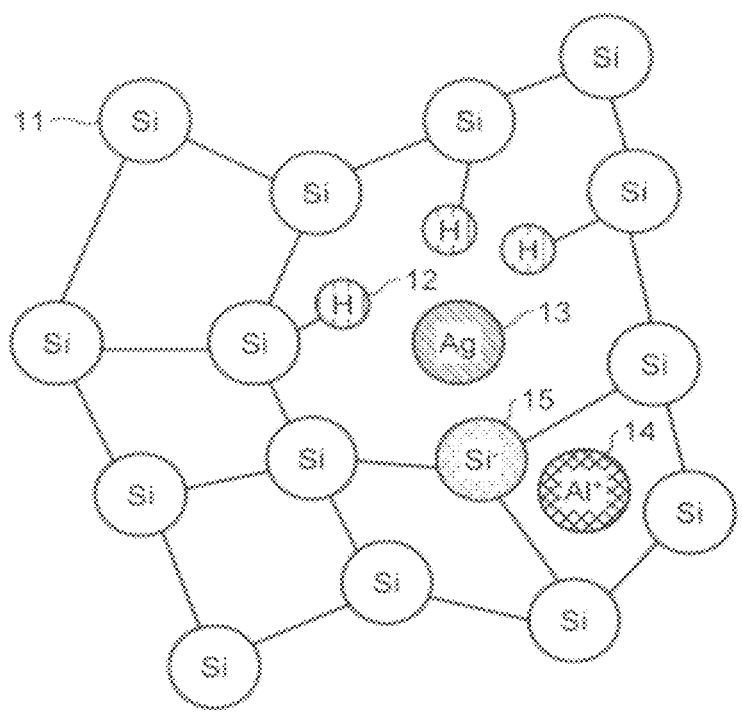
FIG. 6 is a view illustrating a state of the element of the variable resistive layer 2 in FIG. 2D.

FIG. 6 is a view illustrating a state of the element of the variable resistive layer 2 in FIG. 2D.

In FIG. 6, the Al element is deposited in the vicinity of the silicon element 11, and an aluminum ion 14 and a silicon ion 15 are generated. Therefore, the electron e$^-$ of the Ag element 13 constituting the conductive filament F can be prevented from escaping into the silicon element with difficulty. Thus, the Ag element 13 in the variable resistive layer 2 can be inhibited from being ionized.

A result of formulation based on physical models in FIGS. 3 and 4 will be described below.

An electrode reaction is electrochemically described in the following Butler-Volmer equation:

$$J = 2J_0 \sin h(q_e \Delta \eta_1/(2k_B T))$$

wherein $J_o$ is referred to as an exchange current density which is a parameter corresponding to a reaction speed of an electrode. $\Delta \eta_1$ is referred to as an overvoltage for generating the electrode reaction which is a parameter corresponding to an activation energy of the electrode reaction. J represents a density of a current flowing to an electrode, $k_B$ represents a Boltzmann constant (=1.3807×10$^{-23}$ J/K), T represents an absolute temperature (=300 K), and $q_e$ represents an electric charge of an electron (=1.6022×10$^{-19}$ C).

Since it is supposed that a length l(t) of the conductive filament F formed in the amorphous silicon grows corresponding to an electric charge moved by the electrode reaction, furthermore, it can be obtained in accordance with the following equation:

$$dl(t)/dt \approx 1/(\rho_{Ag} q_e) F_f J, \ 0 < l(t) < 1$$

wherein l represents a distance between electrodes and $\rho_{Ag}$ represents a density of an Ag crystal (=5.85×10$^{22}$ cm$^{-3}$). $F_f$ represents a normalized effective electrode reaction cross section which is obtained by the following equation, wherein an effective electrode reaction cross section is represented by $S_f$ and an electrode surface area is represented by S.

$$F_f = S_f/S$$

Furthermore, a voltage drop $\Delta \eta_2$ generated between the electrodes is obtained in accordance with the following equation by using a conductivity of the conductive filament F (=a minimum metal conductivity 2.84×10$^2$Ω$^{-1}$ cm$^{-1}$):

$$\Delta \eta_2 = ((l-l(t))/\rho_{Ag}^+ + l(t)/\rho_{Ag}/F_f)J$$

wherein $\rho_{Ag}^+$ represents a conductivity of an Ag ion in the amorphous silicon.

Furthermore, a voltage V(t) applied to the electrodes is given by a sum of an overvoltage $\Delta \eta_1$ and a voltage drop $\Delta \eta_2$ as will be described in the following equation.

$$V(t) = \Delta \eta_1 + \Delta \eta_2$$

When the electrode surface area S is 50 nm×50 nm and the distance l between electrodes is 80 nm, the normalized effective electrode reaction cross section $F_f$, the conductivity $\rho_{Ag}^+$ of the Ag ion, and the exchange current density $J_0$ have the following values for the result of the experiment in the Non-Patent Document 1.

Ff≈0.2
$\rho_{Ag^+} \approx 9.4 \times 10^{-7} \Omega^{-1} \text{ cm}^{-1}$
$J_0 \approx 9.4 \times 10^{-17} \text{ A/cm}^2$ As a result, it is found that approximately one-fifth of the electrode surface area is effectively concerned in a reaction when the amorphous silicon is used for the variable resistive layer 2. Furthermore, a value of the overvoltage $\Delta\eta_1$ which is necessary for setting is calculated to be 3.2 V. It is concluded that a current is rapidly raised if the voltage is exceeded.

In a current-voltage characteristic in set and reset of the nonvolatile variable resistance element, moreover, the resistance of the Ag ion in the amorphous silicon is reflected. Therefore, a history is generated in the current value in the cases in which the voltage is raised and dropped.

From the simulation result, the following method can be proposed in order to optimize the electrode material of the second electrode 3 of the nonvolatile variable resistance element.

First of all, it is important to reduce an activation energy for generating a decomposition reaction ($M \rightarrow M^+ + e^-$) in an interface between the second electrode 3 and the variable resistive layer 2 in order to reduce a driving voltage of the nonvolatile variable resistance element. M represents a metal element.

Secondly, it is supposed that a metal causing a quick ion diffusion in the variable resistive layer 2 is preferably used for the second electrode 3 in order to enhance a switching speed for changing over an ON state and an OFF state.

Thirdly, it is preferable to select a material having a high activation energy of the decomposition reaction ($M \rightarrow M^+ + e^-$) in the surface of the conductive filament F formed on the variable resistive layer 2 in order to enhance the data retention characteristic.

If the electrode material is singly used for the second electrode 3, a reset voltage is raised. For this reason, in the embodiment described above, an electrode material constituted by at least two types of metal elements is used for the second electrode 3 to optimize a composition ratio thereof. In a memory operation, furthermore, there is used an alloy for creating an eutectic in which metals act independently in consideration of a necessity for returning into an initial electrode condition after set/reset process.

In other words, attention is paid to the Al element as a metal element which creates an eutectic together with the 1B group element having the same property as the Ag element and does not make siliciding. As a technique for optimizing an electrode material, there is employed the technique of SP-GGA (Spin-Polarized Generalized Gradient Approximation) for carrying out a simulation based on a first principle calculation and considering a spin polarization when a local density functional approximation is exceeded. In order to investigate an action in a silicon layer of a metal element, there is calculated a generation energy in an arrangement in which a single metal element or a plurality of (n) metal elements is/are disposed in a position between grids of a unit cell containing 64 silicon elements. A generation energy $E_f$ can be defined in accordance with the following equation by using a full energy E of each cell structure.

$E_f(nM) = [-E(\text{a cell structure having 64 silicon elements containing } n \text{ metal elements } M) + E(\text{a cell structure having 64 silicon elements}) + nE(\text{a single metal element } M \text{ in vacuum})]/n$ Moreover, a generation energy of an Si unit cell containing a conductive filament can be obtained by executing a calculation related to a structure in which a metal element is disposed at an interval of 2.5 Å in a (110) direction. Based on the generation energy thus obtained, three variables to be important in respect of a memory application ((1) a driving voltage, (2) a switching speed and (3) a data retention characteristic) are evaluated by using values of (1) $E_f(M)-E_f(M^+)$ (an activation energy for ionization), (2) a square of a distance between electrodes/a diffusion coefficient of $M^+$ in Si, and (3) $E_f(M)-E_f(M \text{ filament})$ (a coagulation energy in Si), respectively.

Figure 7:
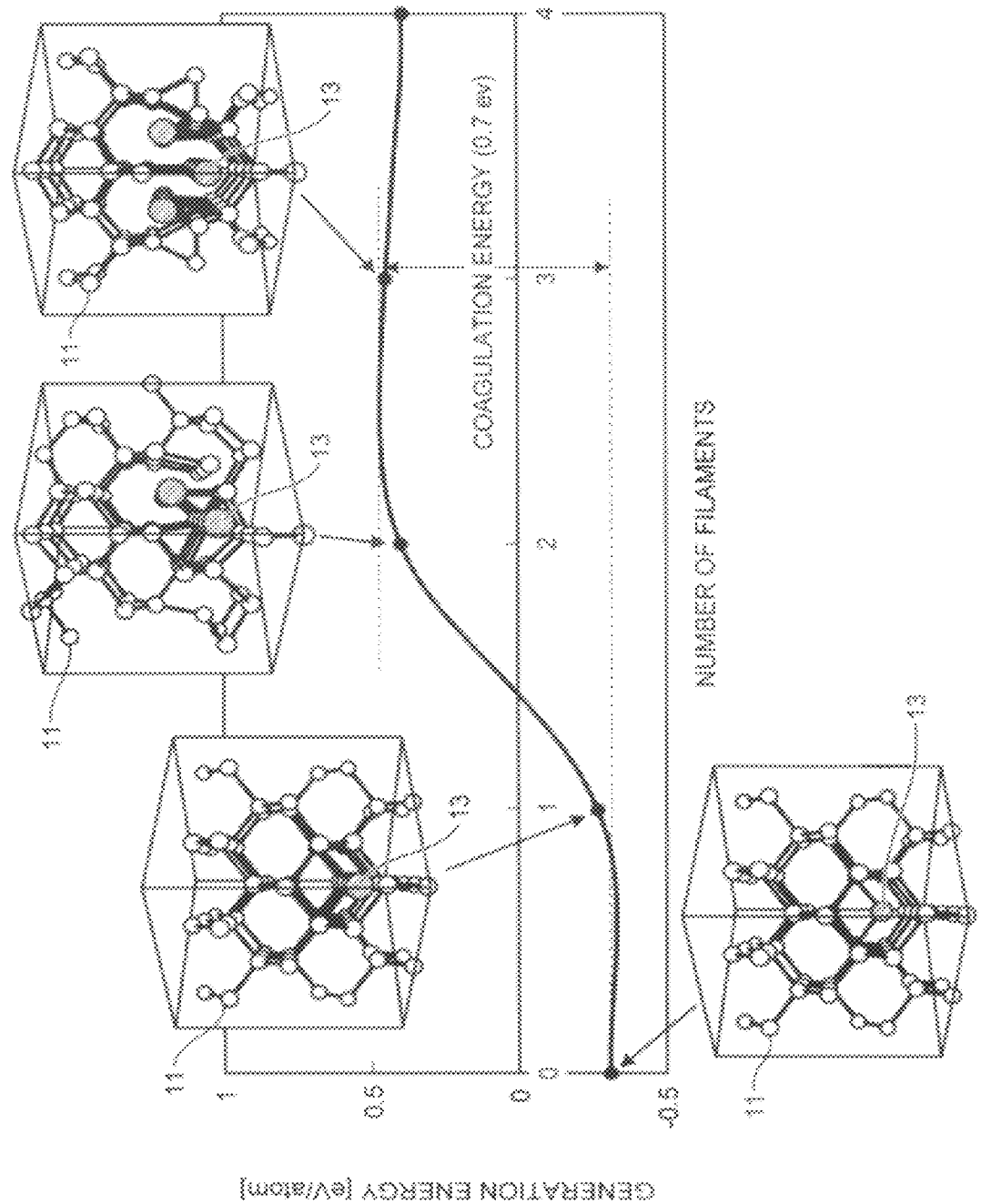
FIG. 7 is a chart illustrating a relationship between the number of conductive filaments F and a generation energy without an aluminum ion Al$^+$ in the variable resistive layer 2 of FIG. 2D.

FIG. 7 is a chart illustrating a relationship between the number of the conductive filaments F and the generation energy in the case in which the aluminum ion $Al^+$ is not contained in the variable resistive layer 2 of FIG. 2D.

In FIG. 7, there is calculated an electron state of an Si unit cell containing a single neutral Ag element or a single Ag ion respectively. As a result, in both cases, it is found that a quantity of electric charges of the Ag element is not changed and there is no bond with surrounding silicon elements. Therefore, it can be supposed that the ionization is made by an electrostatic repulsion with a silicon element in which an electron falls from the surrounding silicon elements and which is charged to be positive when the Ag element is ionized.

The case in which the single Ag element penetrates represents a result of a calculation with the number of the filaments set to be zero. At this time, the generation energy is negative. In other words, the neutral Ag element penetrating in the Si unit cell has no energy gain. For this reason, it is indicated that the ionization is immediately made.

Furthermore, the case in which four Ag elements penetrate side by side represents a result of a calculation with the number of the filaments set to be one. Also in this case, the generation energy is negative and an instability is made on an energy basis.

In addition, the case in which a structure in which four Ag elements are arranged is provided in at least two lines represents a result of a calculation with the number of the filaments set to be two or more. At this time, the bond of the Ag elements is strengthened so that the generation energy is also positive. The coagulation energy in Si is estimated to be low, that is, 0.7 eV. Also at a temperature which is close to a room temperature, there is a possibility that the generated conductive filament might be broken. Moreover, an activation energy in an ionizing process for the silver Ag is calculated to be 6.4 eV.

Referring to the aluminum Al, the same calculation is executed. As a result, it is found that the same ionizing process as that for the silver Ag is made. Thus, it is apparent that the coagulation energy is 1.2 eV and the activation energy of the ionizing process is 5.8 eV.

From the result, it is possible to reduce the set voltage and to enhance the data retention characteristic by using the Al element as an electrode material as compared with the case in which the Ag element is used as the electrode material. The Al element has a lower diffusion coefficient in Si by five digits or more as compared with the Ag element, and a switching speed is remarkably reduced. Moreover, it is supposed that the reset voltage is also raised because the activation energy in the ionizing process is high.

Therefore, it is possible to enhance the data retention characteristic while suppressing a reduction in the switching speed and a rise in the reset voltage by using, as the electrode material, an Al—Ag eutectic having an Al element added thereto without singly using the Al element or the Ag element as the electrode material. Furthermore, the same effects can be expected also in the case in which the Al element is added to the 1B group element having the same property as the Ag element.

Figure 8A:
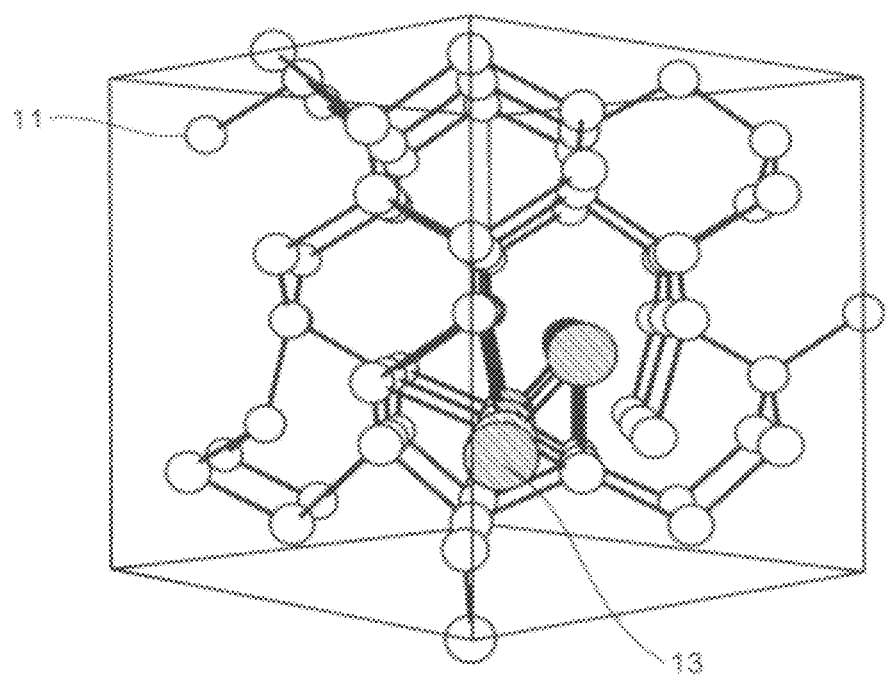
FIG. 8A is a view illustrating a result of a calculation for a stable position in a formation of two Ag filaments on the variable resistive layer 2 in FIG. 1
Figure 8B:
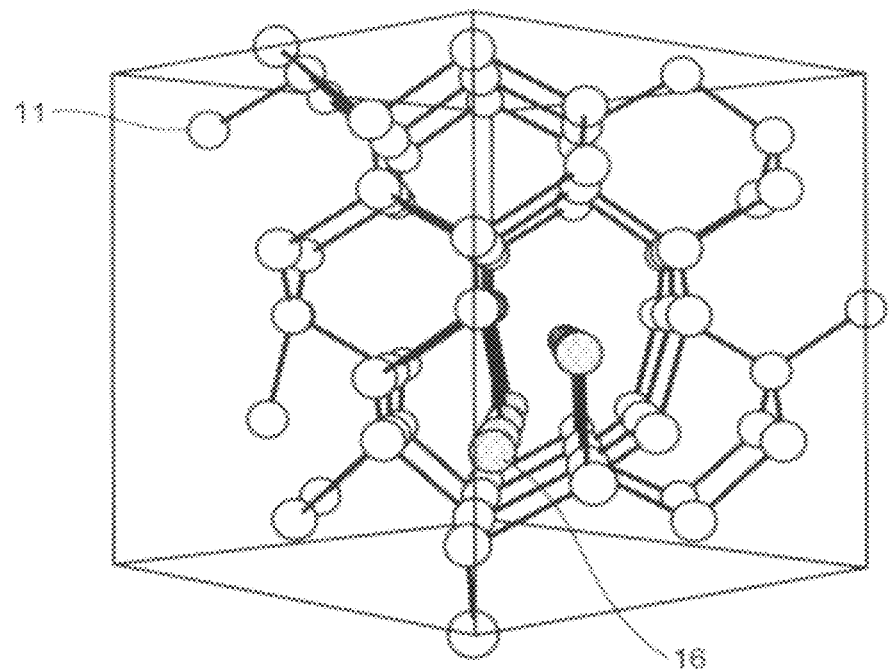
FIG. 8B is a view illustrating a result of a calculation for the stable position in the formation of two Al filaments on the variable resistive layer 2 in FIG. 1.

FIG. 8A is a view illustrating a result of a calculation in a stable position in the case in which two Ag filaments are formed on the variable resistive layer 2 in FIG. 1, and FIG. 8B is a view illustrating a result of a calculation in a stable position in the case in which two Al filaments are formed on the variable resistive layer 2 in FIG. 1.

In FIG. 8A, a minimum distance between metals of an Ag filament formed in an Si unit cell is almost equal to a distance between metals (2.89 Å) of an Ag crystal of a bulk, and a conductive filament is formed by a coagulation of Ag elements 13.

On the other hand, a minimum distance between metals (2.97 Å) of an Al filament formed in the Si unit cell is greater than a distance between metals (2.86 Å) of an Al crystal of a bulk, and the Ag element 13 is deposited close to a silicon element around the Al element 16. For this reason, a resistance of the Al filament is higher than that of the Ag filament.

Based on the result described above, the Ag element 13 is deposited intentionally in a void in the Si crystal and the Ag elements 13 coagulate each other so that a conductive filament is formed easily, while an Al element 15 is deposited in the vicinity of the silicon element and easily bonds to the silicon element. Moreover, a minimum distance between Al and Si in the Si unit cell (2.48 Å) is smaller than a minimum distance between Ag and Si (2.59 Å).

Second Embodiment

Next, description will be given to a method of manufacturing a nonvolatile variable resistance element according to a second embodiment. In the second embodiment, there will be taken, as an example, the case in which p type Si, an amorphous silicon and a silver Ag are used as the first electrode 1, the variable resistive layer 2 and the second electrode 3 in FIG. 1 respectively.

For example, a B ion is implanted into a silicon single crystal substrate on a condition of an acceleration voltage of 30 keV and a dose amount of $2 \times 10^{15}$ cm$^{-2}$, and a p type Si region formed by subsequently executing activation annealing is set to be a first electrode 1.

For instance, then, an amorphous silicon layer is deposited as a variable resistive layer 2 by plasma-enhanced chemical vapor deposition (PECVD). At this time, it is possible to vary a dangling bond density ratio in the amorphous silicon layer by regulating a flow ratio of a monosilane molecule (SiH$_4$) to be a source gas and hydrogen. By optimizing the flow rate of the hydrogen at this time, it is possible to minimize the dangling bond density in a void portion. At the same time, it is possible to reduce an Si density of the amorphous silicon layer generated at this time by raising a pressure in a chamber in a formation of a film.

The Si density of the amorphous silicon layer can be confirmed by XRR measurement (X-ray reflectance measurement). The Si density of the amorphous silicon layer can be regulated to be 2.2 g/cm$^3$.

Next, an evaporation rate of Al and Ag is regulated so that an Al—Ag eutectic having a predetermined composition ratio is deposited on the variable resistive layer 2 and the second electrode 3 is formed on the variable resistive layer 2. As a method of fabricating the Al—Ag eutectic as the second electrode 3, it is also possible to use cosputtering. By this method, a composition ratio of an Al element is regulated to be 0.05 in order to satisfy the following equation (1).

$$X \geq (1.0 - Y/2.3) \tag{1}$$

It is possible to confirm a composition ratio of the Al—Ag eutectic by using the ICP emission spectroanalysis. In a nonvolatile variable resistance element thus fabricated, a decomposition reaction of an Ag filament deposited on the variable resistive layer 2 is suppressed. Therefore, it is possible to enhance a data retention characteristic.

Third Embodiment

FIGS. 9A-9F are sectional views schematically illustrating a generation process and a disappearance process for a conductive filament of a nonvolatile variable resistance element according to a second embodiment. Description will be given on the assumption that a 1B group element of a second electrode 3' is a silver Ag.

In FIG. 9A, in the nonvolatile variable resistance element, the second electrode 3' is provided in place of the second electrode 3 in FIG. 1. Referring to the second electrode 3 of FIG. 1, the composition ratio X of the Al element is set in such a manner that the Al element does not coagulate in the variable resistive layer 2 in setting. Referring to the second electrode 3' of FIG. 9A, it is possible to set the composition ratio X of the Al element in such a manner that the Al element coagulates in the variable resistive layer 2 in setting.

As illustrated in FIG. 9B, in the generation process for a conductive filament F1, a power supply Dli is connected between a first electrode 1 and the second electrode 3', and the second electrode 3' is set to have a higher electric potential than the first electrode 1. Consequently, a first set voltage is applied to the second electrode 3'.

When the first set voltage is applied to the second electrode 3', the aluminum Al of the second electrode 3' is ionized over an interface between the variable resistive layer 2 and the second electrode 3', an aluminum ion Al$^+$ penetrates the variable resistive layer 2, and furthermore, an electron e$^-$ is supplied to the variable resistive layer 2 through the first electrode 1. In the variable resistive layer 2, the aluminum ion Al$^+$ and the electron e$^-$ bond so that a conductive filament F1 formed of the aluminum Al grows from the first electrode 1 side.

As illustrated in FIG. 9C, then, the conductive filament F1 formed of the aluminum Al grows over the variable resistive layer 2, and the first electrode 1 and the second electrode 3' are short-circuited through the conductive filament F1. Consequently, the nonvolatile variable resistance element is set into a first low resistive state.

At this time, the Ag element has a higher activation energy for ionization than the Al element. Therefore, a conductive filament F2 formed of the silver Ag is not made to grow on the variable resistive layer 2 but the conductive filament F1 formed of the aluminum Al can be made to grow on the variable resistive layer 2. Although the first set voltage can ionize the Al element, it is preferable to set such a value that the Ag element cannot be ionized.

In the generation process for a conductive filament F2, next, a power supply D12 is connected between a first electrode 1 and the second electrode 3' as illustrated in FIG. 9D, and the second electrode 3' is set to have a higher electric potential than the first electrode 1. Consequently, a second set voltage is applied to the second electrode 3'. The second set voltage can be set to have a value which is greater than the first set voltage and can ionize the Ag element.

When the second set voltage is applied to the second electrode 3', the silver Ag of the second electrode 3' is ionized over an interface between the variable resistive layer 2 and the second electrode 3', a silver ion Ag$^+$ penetrates the variable resistive layer 2, and furthermore, an electron e$^-$ is supplied to the variable resistive layer 2 through the first electrode 1. In the variable resistive layer 2, the silver ion Ag$^+$ and the electron e$^-$ bond so that a conductive filament F2 formed of the silver Ag grows from the first electrode 1 side.

As illustrated in FIG. 9E, then, the conductive filament F2 formed of the silver Ag grows over the variable resistive layer 2, and the first electrode 1 and the second electrode 3' are short-circuited through the conductive filament F2. Consequently, the nonvolatile variable resistance element is set into a second low resistive state.

The conductive filament F1 is easily formed close to the silicon element, and the conductive filament F2 is easily formed in a void portion between the silicon elements. For this reason, places in which the conductive filaments F1 and F2 are made to easily grow in the amorphous silicon layer are different from each other, and it is possible to suppress the mutual inhibition of the formation of the conductive filaments F1 and F2. Therefore, the conductive filaments F1 and F2 can be disposed in the variable resistive layer 2 in parallel. Therefore, a resistance value in the second low resistive state can be set to be smaller than that in the first low resistive state, and the resistance of the variable resistive layer 2 can be varied stepwise depending on a voltage to be applied between the first electrode 1 and the second electrode 3'. Consequently, it is possible to made the nonvolatile variable resistance element to be multivalued while ensuring a tolerance of the resistance value in the first low resistive state and the resistance value in the second low resistive state.

For example, in the case in which the resistance of the conductive filament F1 is represented by $R_1$ and the resistance of the conductive filament F2 is represented by $R_2$, a resistance between the first electrode 1 and the second electrode 3' in FIG. 9C is represented by $R_1$ and a resistance between the first electrode 1 and the second electrode 3' in FIG. 9E is represented by $R_1 R_2/(R_1+R_2)$. In order to stepwise change the resistance of the variable resistive layer 2, accordingly, it is necessary to sufficiently increase a change in the resistance $\Delta R = R_1 - R_1 R_2/(R_1+R_2) = R_1/(1+R_2/R_1)$. From a result of a first principle calculation, however, it is supposed that $R_1 > R_2$ is set. Therefore, a sufficient change in a resistance can be expected. In order to implement a multivalue, furthermore, a change in a resistance by at least one digit is generally required. For this reason, the resistance $R_2$ needs to be one-tenth of the resistance $R_1$ or less, and it is desirable that the composition ratio X of the Al element should be equal to or lower than 0.1. In addition, it is preferable that a range of the composition ratio of the Al element should be set to satisfy the following equation (2) in consideration of the easiness of the deposition of the Ag element in the void.

$$X/Y \leq 0.1/2.3 = 0.043 \qquad (2)$$

On the other hand, as illustrated in FIG. 9F, a power supply D13 is connected between the first electrode 1 and the second electrode 3', and the first electrode 1 is set to have a higher electric potential than the second electrode 3' so that a reset voltage is applied to the second electrode 3' in the disappearance process for the conductive filaments F1 and F2.

When the reset voltage is applied to the second electrode 3', a hole h+ is supplied to the variable resistive layer 2 through the first electrode 1 so that the aluminum Al of the conductive filament F1 and the silver Ag of the conductive filament F2 are ionized in the variable resistive layer 2. Then, the aluminum ion Al+ and the silver ion Ag+ are collected into the second electrode 3' and the conductive filaments F1 and F2 are cut in the variable resistive layer 2 so that the nonvolatile variable resistance element is reset into the high resistive state.

Figure 10:
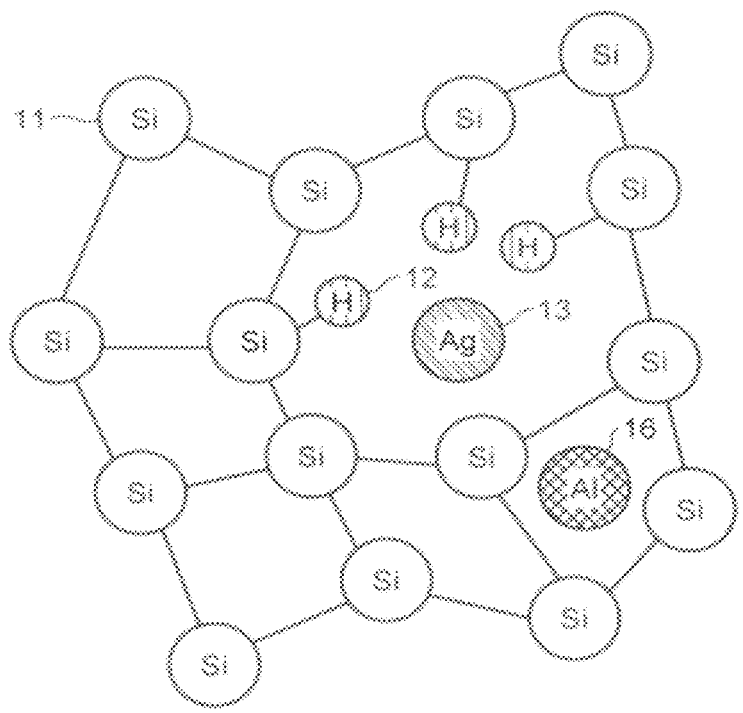
FIG. 10 is a view illustrating a state of an element of a variable resistive layer 2 in FIG. 9E.

FIG. 10 is a view illustrating a state of the element of the variable resistive layer 2 in FIG. 9E.

In FIG. 10, an Al element 16 is apt to be deposited in the vicinity of the silicon element 11 and an Ag element 13 is apt to be deposited in a void portion between the silicon elements. For this reason, the conductive filament F1 is easily formed close to the silicon element and the conductive filament F2 is easily formed in the void portion between the silicon elements. Consequently, it is possible to suppress a mutual inhibition of the formation of the conductive filaments F1 and F2.

Figure 11:
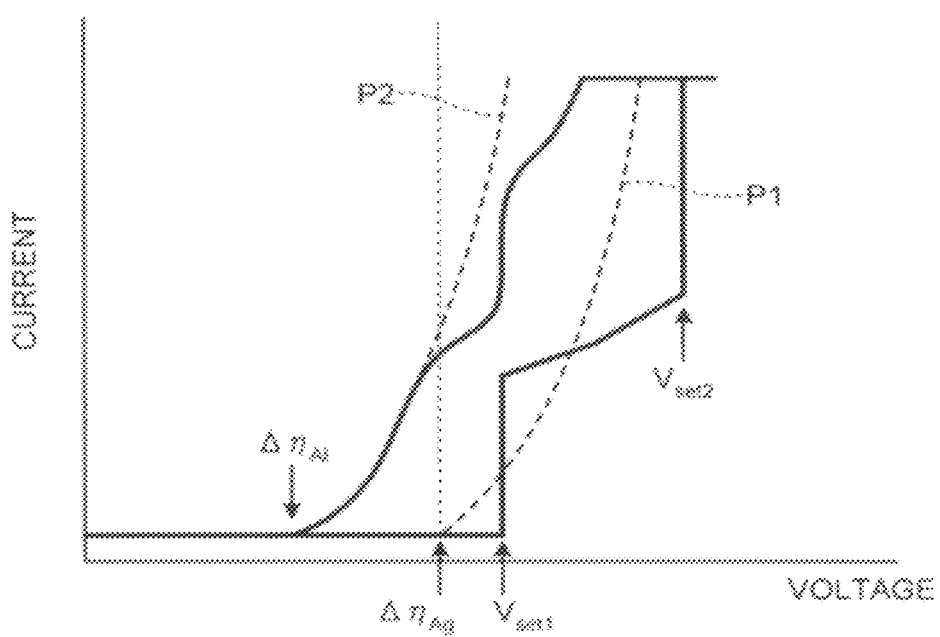
FIG. 11 is a chart illustrating a current-voltage characteristic in set and reset of the nonvolatile variable resistance element in FIG. 9.

FIG. 11 is a chart illustrating a current-voltage characteristic in set and reset of the nonvolatile variable resistance element in FIG. 9.

In FIG. 11, at this time, the current-voltage characteristic in reset in the use of an Ag electrode is represented by P1 and the current-voltage characteristic in reset in the use of an Al electrode is represented by P2, and an activation energy $\Delta\eta_{Ag}$ for ionizing the Ag element is higher than an activation energy $\Delta\eta_{Al}$ for ionizing the Al element by approximately 0.6 V.

If a voltage to be applied to the second electrode 3' is increased in a positive direction, then, a current flowing between the first electrode 1 and the second electrode 3' is suddenly increased when a first set voltage Vset1 is reached. At this time, the activation energy $\Delta\eta_{Ag}$ for ionizing the Ag element is higher than the activation energy $\Delta\eta_{Al}$ for ionizing the Al element by approximately 0.6 V. Therefore, the Ag element is not ionized but the Al element is ionized. For this reason, the conductive filament F2 is not formed but the conductive filament F1 can be formed.

If the voltage to be applied to the second electrode 3' is increased in the positive direction, furthermore, the current flowing between the first electrode 1 and the second electrode 3' is increased slowly. When a second set voltage Vset2 is reached, the current flowing between the first electrode 1 and the second electrode 3' is increased further rapidly. At this time, the Ag element is ionized and the conductive filament F2 is formed.

Fourth Embodiment

Next, description will be given to a method of manufacturing a nonvolatile variable resistance element according to a fourth embodiment. In the fourth embodiment, there will be taken, as an example, the case in which p-type Si, an amorphous silicon and a silver Ag are used as a first electrode 1, a variable resistive layer 2 and a second electrode 3' in FIG. 9A respectively.

In the same manner as in the second embodiment, the first electrode 1 and the variable resistive layer 2 are formed. Next, an evaporation rate of Al and Ag is regulated to deposit an Al—Ag eutectic having a predetermined composition ratio on the variable resistive layer 2 and to form the second electrode 3' on the variable resistive layer 2. At this time, it is desirable to simultaneously satisfy the equation (1) from a viewpoint of an enhancement in a data retention characteristic in order to satisfy the equation (2). For this reason, it is preferable to regulate the range of a silicon density Y of the variable resistive layer 2 in order to satisfy the following equation (3). For example, 2.2 g/cm³ can be obtained.

$$2.3 > Y \geq 2.09$$

For example, moreover, a composition ratio X of an Al element contained in the second electrode 3' can be regulated to be 0.09. The composition ratio X of the Al element at this time has a greater value than the composition ratio X of the second electrode 3 in FIG. 1. Consequently, it is possible to make the Al element to coagulate in the variable resistive layer 2, thereby causing the nonvolatile variable resistance element to be multivalued.

In the nonvolatile storage device thus fabricated, an Al filament and an Ag filament can be deposited sequentially so that a current/voltage characteristic can be stepwise depending on a voltage applied to the second electrode 3'. Furthermore, a multivalue can be obtained through the voltage differently from a current compliance control method.

Therefore, a capacity can be increased. In addition, the decomposition reaction of the Ag filament deposited in the variable resistive layer 2 is also suppressed. Therefore, it is possible to implement a multivalued memory which is also excellent in a data retention characteristic.

Fifth Embodiment

Figure 12A:
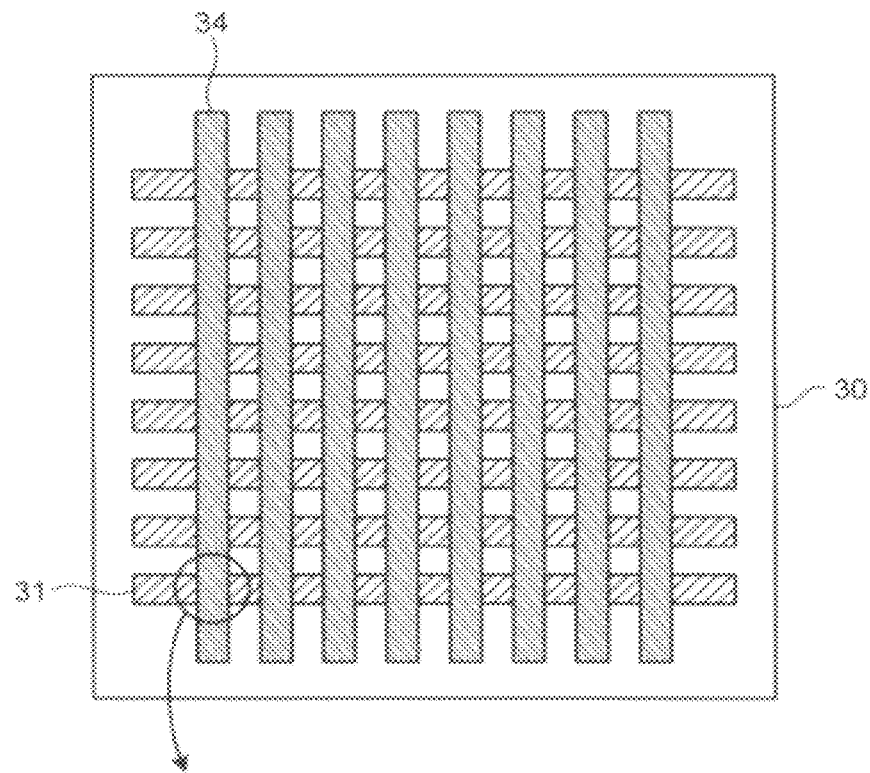
FIG. 12A is a plan view illustrating a schematic structure of a memory cell array to which a nonvolatile variable resistance element according to a fifth embodiment is applied and FIG. 12B is a sectional view illustrating a schematic structure of a cross point portion of the memory cell array in FIG. 12A.
Figure 12B:
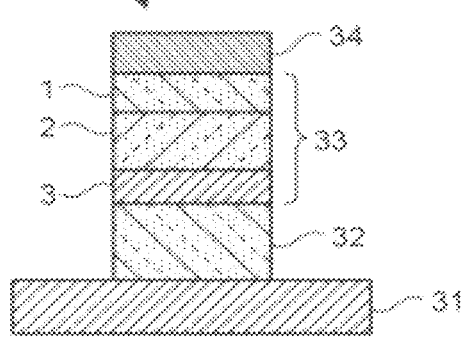

FIG. 12A is a plan view illustrating a schematic structure of a memory cell array to which a nonvolatile variable resistance element according to a fifth embodiment is applied, and FIG. 12B is a sectional view illustrating a schematic structure of an cross point portion of the memory cell array in FIG. 12A.

In FIGS. 12A and 12B, in a memory cell array 30, a lower wiring 31 is formed in a column direction and an upper wiring 34 is formed in a row direction. A nonvolatile variable resistance element 33 is disposed through a rectifying device 32 in a cross point portion between the lower wiring 31 and the upper wiring 34. As the nonvolatile variable resistance element 33, it is possible to use the nonvolatile variable resistance element in FIG. 1 or FIG. 9A, for instance. Although the description has been given to the method of providing the rectifying device 32 on the nonvolatile variable resistance element 33 in the example of FIG. 12B, moreover, the rectifying device 32 may be removed.

Figure 13:
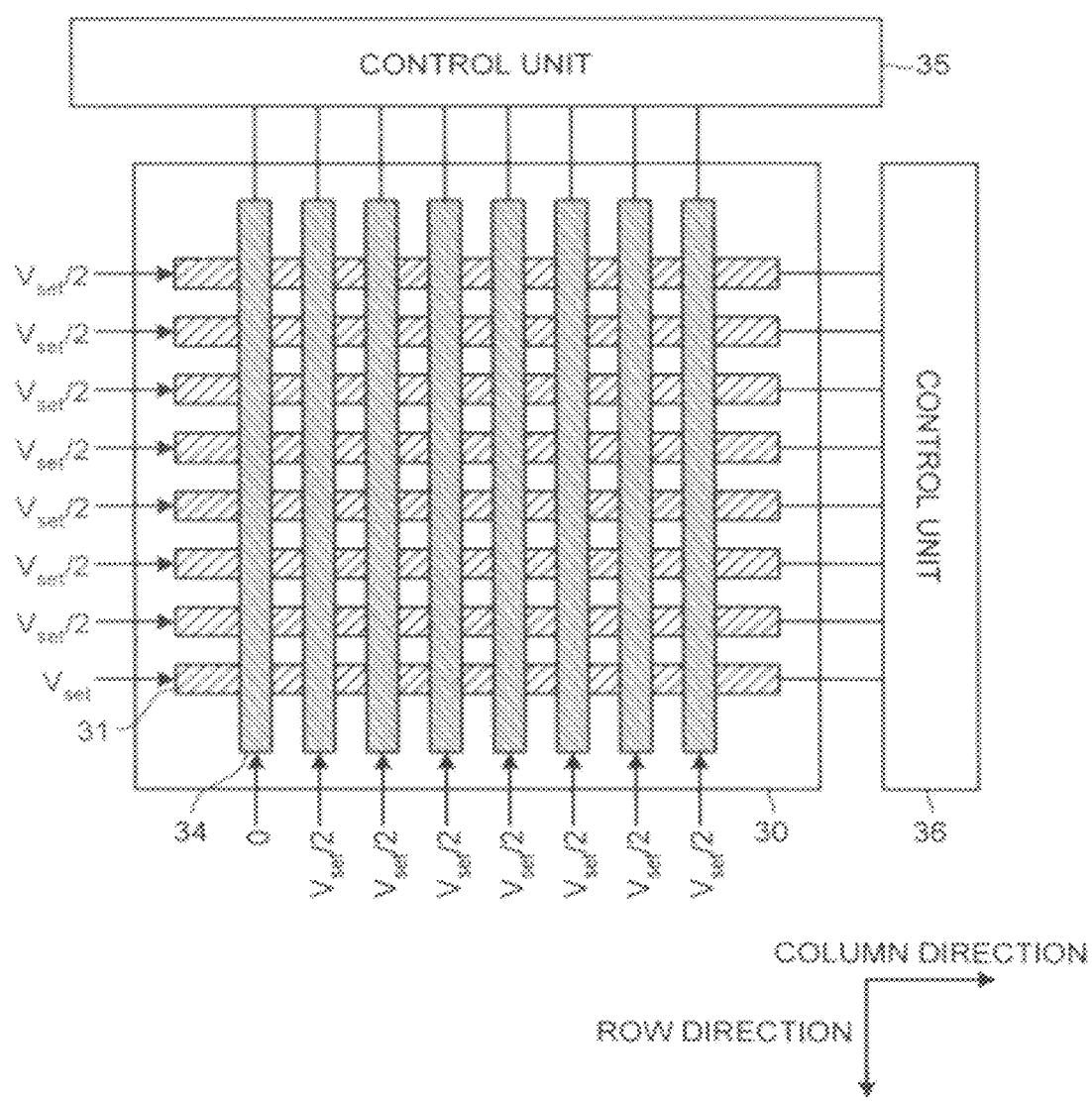
FIG. 13 is a plan view illustrating a voltage setting method in write of a selected cell in the memory array of FIG. 12A.

FIG. 13 is a plan view illustrating a method of setting a voltage in write of a selected cell in the memory cell array in FIG. 12A.

In FIG. 13, a control unit 35 for selecting a row and a control unit 36 for selecting a column are provided around the memory cell array 30. In the case in which the selected cell is written, a set voltage Vset is applied to the lower wiring 31 in a selected column, and a voltage which is a half of the set voltage Vset is applied to the lower wiring 31 in a non-selected column. Moreover, 0V is applied to the upper wiring 34 in a selected row, and a voltage which is a half of the set voltage Vset is applied to the upper wiring 34 in a non-selected row.

As a result, the set voltage Vset is applied to the selected cell which is specified by the selected column and the selected row so that the write is carried out. On the other hand, the voltage which is a half of the set voltage Vset is applied to a half-selected cell which is specified by a non-selected column and a selected row so that the write is prohibited. Moreover, the voltage which is a half of the set voltage Vset is applied to a half-selected cell specified by a selected column and a non-selected row so that the write is prohibited. Furthermore, 0V is applied to a non-selected cell which is specified by a non-selected column and a non-selected row so that the write is prohibited.

Figure 14:
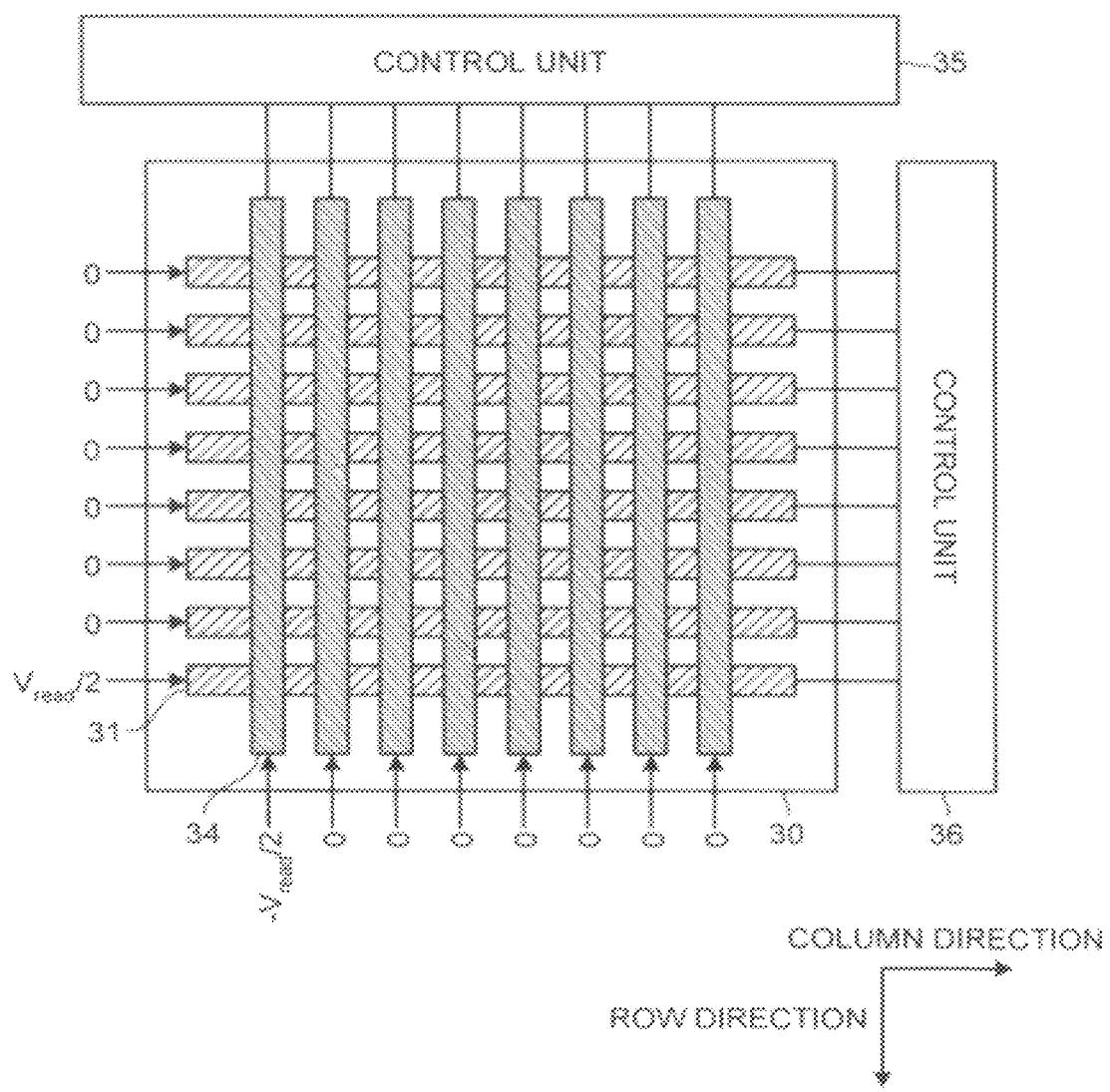
FIG. 14 is a plan view illustrating a voltage setting method in read of the selected cell in the memory cell array in FIG. 12A.

FIG. 14 is a plan view illustrating a voltage setting method in read of the selected cell in the memory cell array of FIG. 12A.

In FIG. 14, in the case in which the selected cell is read, a voltage which is a half of a read voltage Vread is applied to the lower wiring 31 in a selected column, and 0V is applied to the lower wiring 31 in a non-selected column. Moreover, a voltage which is a minus half of the read voltage Vread is applied to the upper wiring 34 in a selected row, and 0V is applied to the upper wiring 34 in a non-selected row.

As a result, the read voltage Vread is applied to the selected cell which is specified by the selected column and the selected row so that the read is carried out. On the other hand, the voltage which is a minus half of the read voltage Vread is applied to a half-selected cell specified by a non-selected column and a selected row so that the read is prohibited. Moreover, the voltage which is a half of the read voltage Vread is applied to a half-selected cell specified by a selected column and a non-selected row so that the read is prohibited. Furthermore, 0V is applied to a non-selected cell which is specified by a non-selected column and a non-selected row so that the read is prohibited.

Figure 15:
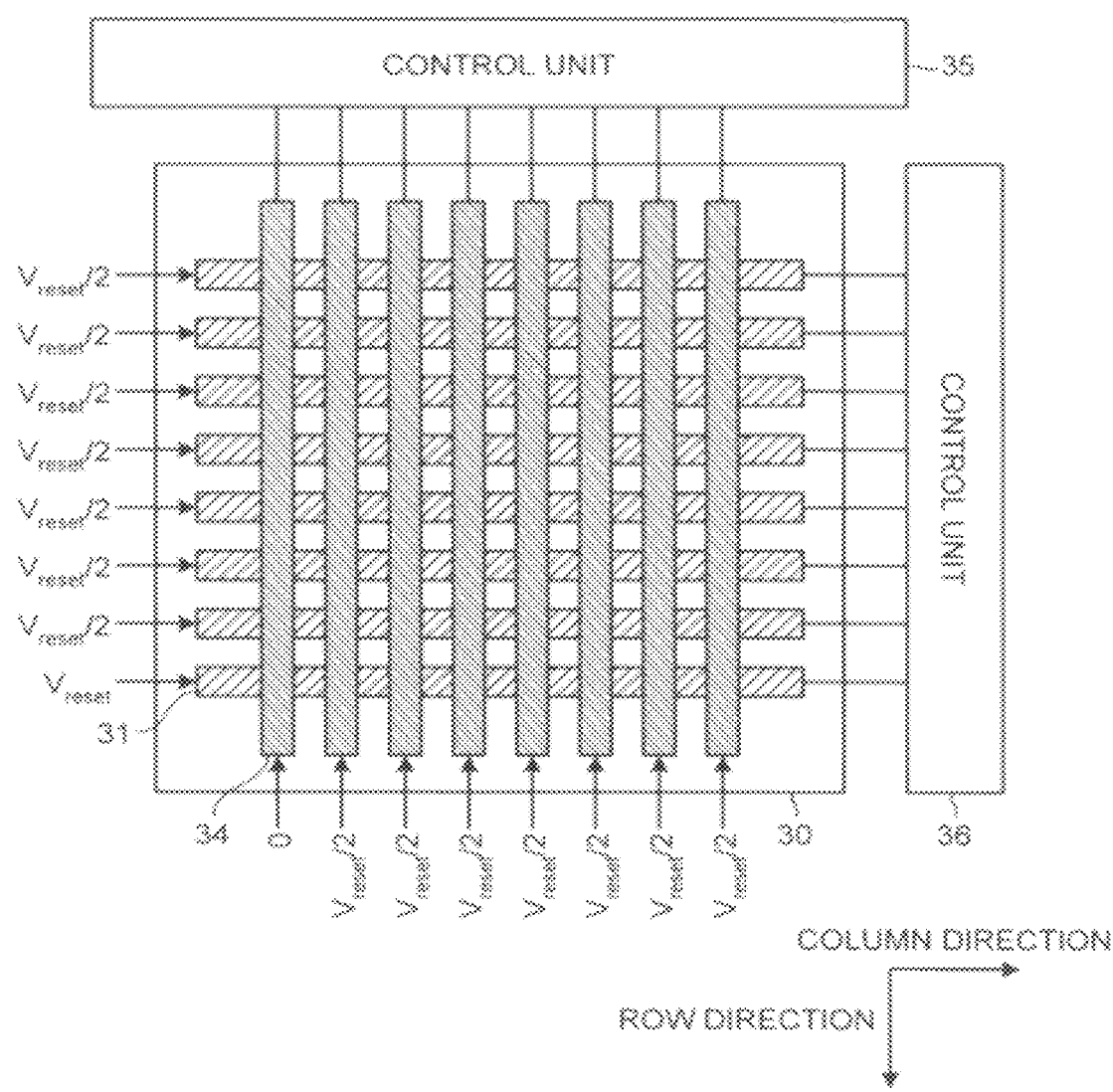
FIG. 15 is a plan view illustrating a voltage setting method in erasure of the selected cell in the memory cell array in FIG. 12A.

FIG. 15 is a plan view illustrating a voltage setting method in erasure of the selected cell in the memory cell array of FIG. 12A.

In FIG. 15, in the case in which the selected cell is erased, a reset voltage Vreset is applied to the lower wiring 31 in a selected column, and a voltage which is a half of the reset voltage Vreset is applied to the lower wiring 31 in a non-selected column. Moreover, 0V is applied to the upper wiring 34 in a selected row, and the voltage which is a half of the reset voltage Vreset is applied to the upper wiring 34 in a non-selected row.

As a result, the reset voltage Vreset is applied to the selected cell which is specified by the selected column and the selected row so that the erasure is carried out. On the other hand, the voltage which is a half of the reset voltage Vreset is applied to a half-selected cell specified by a non-selected column and a selected row so that the erasure is prohibited. Moreover, the voltage which is a half of the reset voltage Vreset is applied to a half-selected cell specified by a selected column and a non-selected row so that the erasure is prohibited. Furthermore, 0V is applied to a non-selected cell which is specified by a non-selected column and a non-selected row so that the erasure is prohibited.

Sixth Embodiment

Figure 16:
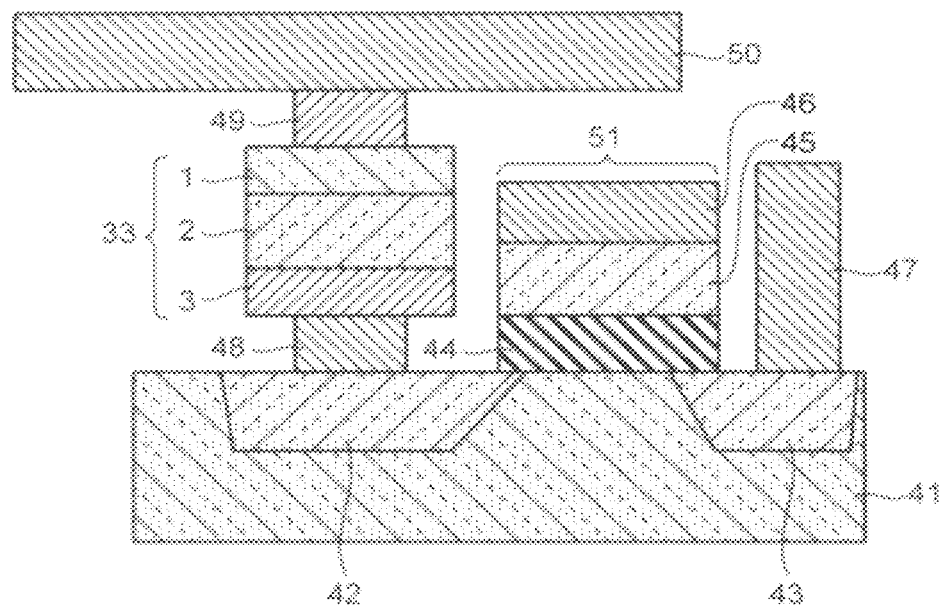
FIG. 16 is a sectional view illustrating a schematic structure of a nonvolatile variable resistance element according to a sixth embodiment.

FIG. 16 is a sectional view illustrating a schematic structure of a nonvolatile variable resistance element according to a sixth embodiment.

In FIG. 16, a gate electrode 45 is formed on a semiconductor substrate 41 through a gate insulating film 44, and a word line 46 is formed on the gate electrode 45. Impurity diffusion layers 42 and 43 are formed on the semiconductor substrate 41 to interpose a channel region formed under the gate electrode 45. Consequently, a transistor 51 is formed. A source line 47 is connected to the impurity diffusion layer 43.

Moreover, a nonvolatile variable resistance element 33 is disposed on the semiconductor substrate 41 adjacently to the transistor 51. As the nonvolatile variable resistance element 33, for example, it is possible to use the same structure as that in FIG. 1. A second electrode 3 of the nonvolatile variable resistance element 33 is connected to the impurity diffusion layer 42 through a connecting conductor 48, and a first electrode 1 of the nonvolatile variable resistance element 33 is connected to a bit line 50 through a connecting conductor 49.

By turning ON the transistor 51 through the word line 46, it is possible to give access to the nonvolatile variable resistance element 33, thereby selecting the nonvolatile variable resistance element 33 to be a reading or writing target.

Although the description has been given to the case in which the structure of FIG. 1 is used as the nonvolatile variable resistance element 33 in the example of FIG. 16, it is also possible to use the structure of FIG. 9A.

Figure 17:
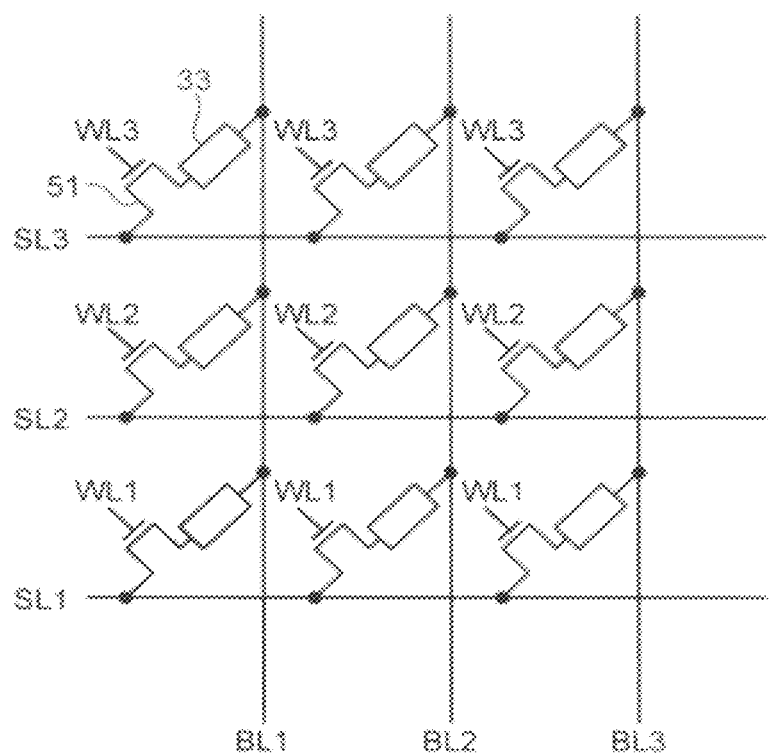
FIG. 17 is a plan view illustrating a schematic structure of a memory cell array to which the nonvolatile variable resistance element in FIG. 16 is applied.

FIG. 17 is a plan view illustrate a schematic structure of a memory cell array to which the nonvolatile variable resistance element in FIG. 16 is applied.

In FIG. 17, bit lines BL1 to BL3 are provided in a column direction and word lines WL1 to WL3 are provided in a row direction over the semiconductor substrate 41 of FIG. 16. The nonvolatile variable resistance element 33 and the transistor 51 are disposed in the cross point portions of the bit lines BL1 to BL3 and the word lines WL1 to WL3, and the nonvolatile variable resistance element 33 and the transistor 51 are connected in series to each other.

One of ends of the nonvolatile variable resistance element 33 in the same column is connected to the same bit lines BL1 to BL3, and one of ends of the transistor 51 in the same row is connected to the same source lines SL1 to SL3. Moreover, the gate electrode 45 of the transistor 51 in the same row is connected to the same word lines WL1 to WL3.

By turning ON the transistor 51 through the word lines WL1 to WL3, it is possible to apply a voltage between the first electrode 1 and the second electrode 3 in the nonvolatile variable resistance element 33 in a selected row. Therefore, it is possible to prevent a current from flowing to the nonvolatile variable resistance element 33 in a non-selected row in the read of the nonvolatile variable resistance element 33 in the selected row. Consequently, it is possible to shorten a time required for the read. While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A nonvolatile variable resistance element comprising:
   a first electrode;
   a second electrode containing a 1B group element and an Al element added thereto; and
   a variable resistive layer disposed between the first electrode and the second electrode and containing a silicon element, wherein the Al element forms an eutectic together with the 1B group element.

2. The nonvolatile variable resistance element according to claim 1, wherein when a composition ratio of the Al element contained in the second electrode is represented by X and a silicon density of the variable resistive layer is represented by Y (g/cm$^3$), X≥1.0−Y/2.3 is obtained.

3. The nonvolatile variable resistance element according to claim 1, wherein when a composition ratio of the Al element contained in the second electrode is represented by X and a silicon density of the variable resistive layer is represented by Y (g/cm$^3$), X/Y≤0.043 is obtained, and
   a resistance of the variable resistive layer is stepwise varied depending on a voltage to be applied to the first electrode and the second electrode.

4. The nonvolatile variable resistance element according to claim 1, wherein the 1B group element is Ag.

5. The nonvolatile variable resistance element according to claim 4, wherein the first electrode is an impurity doped silicon layer.

6. The nonvolatile variable resistance element according to claim 5, wherein the variable resistive layer is an amorphous silicon layer.

7. The nonvolatile variable resistance element according to claim 1, wherein a stacked structure including the first electrode, the variable resistive layer and the second electrode is disposed on an intersection point of a word line and a bit line.

8. The nonvolatile variable resistance element according to claim 7, further comprising a rectifying device disposed between the word line and the bit line.

9. The nonvolatile variable resistance element according to claim 7, further comprising a transistor disposed between the word line and the bit line.

10. The nonvolatile variable resistance element according to claim 1, wherein a stacked structure including the first electrode, the variable resistive layer and the second electrode has at least four resistive states.

11. The nonvolatile variable resistance element according to claim 1, wherein the Al element is not agglomerated in the variable resistive layer in setting.

12. The nonvolatile variable resistance element according to claim 11, wherein a conductive filament constituted by the 1B group element is formed in the variable resistive layer to make a change from a high resistive state to a low resistive state, and the conductive filament in the variable resistive layer is reduced to make a change from the low resistive state to the high resistive state.

13. The nonvolatile variable resistance element according to claim 12, wherein an aluminum ion obtained by ionizing the Al element penetrates into the variable resistive layer before the conductive filament constituted by the 1B group element is formed in the variable resistive layer.

14. The nonvolatile variable resistance element according to claim 1, wherein the Al element is agglomerated in the variable resistive layer in setting.

15. The nonvolatile variable resistance element according to claim 14, wherein a first conductive filament constituted by the Al element is formed in the variable resistive layer to make a change from a high resistive state to a middle resistive state, and a second conductive filament constituted by the 1B group element is further formed in the variable resistive layer to make a change from the middle resistive state to the low resistive state.

16. The nonvolatile variable resistance element according to claim 15, wherein the first conductive filament and the second conductive filament in the variable resistive layer are reduced to make a change from the low resistive state to the high resistive state.

17. The nonvolatile variable resistance element according to claim 16, wherein the 1B group element has a higher activation energy in ionization than the Al element.

18. The nonvolatile variable resistance element according to claim 1, wherein a minimum distance between Al and Si in an Si unit cell is smaller than a minimum distance between the 1B group element and the Si.

19. The nonvolatile variable resistance element according to claim 1, wherein a minimum distance between metals of an Al filament formed in an Si unit cell is greater than a distance between metals of an Al crystal in a bulk.

20. A nonvolatile variable resistance element comprising:
   a first electrode;
   a second electrode containing a 1B group element and an Al element added thereto; and
   a variable resistive layer disposed between the first electrode and the second electrode and containing a silicon element, wherein when a composition ratio of the Al element contained in the second electrode is represented by X and a silicon density of the variable resistive layer is represented by Y (g/cm$^3$), X≥1.0−Y/2.3 is obtained.

* * * * *